United States Patent
Nakashima et al.

(10) Patent No.: US 6,562,465 B1
(45) Date of Patent: May 13, 2003

(54) COATING LIQUID FOR FORMING A SILICA-CONTAINING FILM WITH A LOW-DIELECTRIC CONSTANT AND SUBSTRATE COATED WITH SUCH A FILM

(75) Inventors: Akira Nakashima, Kitakyushu (JP); Atsushi Tonai, Kitakyushu (JP); Michio Komatsu, Kitakyushu (JP)

(73) Assignee: Catalysts & Chemicals Industries Co., Ltd. (JP)

( * ) Notice: Subject to any disclaimer, the term of this patent is extended or adjusted under 35 U.S.C. 154(b) by 0 days.

(21) Appl. No.: 09/446,686

(22) PCT Filed: Apr. 15, 1999

(86) PCT No.: PCT/JP99/02017
§ 371 (c)(1),
(2), (4) Date: Dec. 23, 1999

(87) PCT Pub. No.: WO99/55789
PCT Pub. Date: Nov. 4, 1999

(30) Foreign Application Priority Data

Apr. 24, 1998 (JP) .......................... 10-115082
May 21, 1998 (JP) .......................... 10-139723

(51) Int. Cl.[7] .................. B32B 27/36; B32B 13/04; B32B 9/04; B32B 3/26
(52) U.S. Cl. ................ 428/412; 428/312.6; 428/319.1; 428/391; 428/446; 428/447; 106/286.1–287.16
(58) Field of Search .......................... 428/312.6, 319.1, 428/391, 447, 412, 446, 405, 429, 145, 1.52; 522/40, 37; 528/18, 37; 106/286.1–287.16

(56) References Cited

U.S. PATENT DOCUMENTS

| | | | | | |
|---|---|---|---|---|---|
| 3,903,052 A | * | 9/1975 | Wagner et al. | .......... | 260/75 TN |
| 4,080,190 A | * | 3/1978 | Law et al. | .......... | 71/67 |
| 4,103,045 A | * | 7/1978 | Lesaicherre et al. | .......... | 427/82 |
| 4,321,400 A | * | 3/1982 | Ashby | .......... | 556/410 |
| 4,405,679 A | * | 9/1983 | Fujioka et al. | .......... | 427/387 |
| 4,678,688 A | * | 7/1987 | Itoh et al. | .......... | 427/387 |
| 4,840,778 A | | 6/1989 | Arai et al. | .......... | 423/324 |
| 5,010,158 A | * | 4/1991 | Colombier et al. | .......... | 528/28 |
| 5,010,159 A | | 4/1991 | Bank et al. | .......... | 528/23 |
| 5,179,134 A | * | 1/1993 | Chu et al. | .......... | 522/37 |
| 5,190,804 A | * | 3/1993 | Seto et al. | .......... | 428/122 |
| 5,212,211 A | * | 5/1993 | Welch, II et al. | .......... | 522/37 |
| 5,237,082 A | * | 8/1993 | Leir et al. | .......... | 556/413 |
| 5,256,487 A | * | 10/1993 | Myers | .......... | 428/446 |
| 5,278,273 A | * | 1/1994 | Aoai et al. | .......... | 528/28 |
| 5,409,777 A | * | 4/1995 | Kennedy et al. | .......... | 428/411.1 |
| 5,415,927 A | * | 5/1995 | Hirayama et al. | .......... | 428/307.3 |
| 5,492,762 A | * | 2/1996 | Hirai et al. | .......... | 252/500 |
| 5,518,818 A | * | 5/1996 | Kidai et al. | .......... | 428/412 |
| 5,614,603 A | * | 3/1997 | Harkness et al. | .......... | 528/14 |
| 5,665,848 A | * | 9/1997 | Barnard et al. | .......... | 528/24 |
| 5,695,851 A | * | 12/1997 | Watanabe et al. | .......... | 428/147 |
| 5,755,867 A | * | 5/1998 | Chikuni et al. | .......... | 106/287.11 |
| 5,773,548 A | * | 6/1998 | Schickmann et al. | .......... | 528/18 |
| 5,874,164 A | * | 2/1999 | Caldwell | .......... | 428/306.6 |
| 5,902,851 A | * | 5/1999 | Yamaki et al. | .......... | 524/506 |
| 6,090,873 A | * | 7/2000 | Okibe et al. | .......... | 524/265 |
| 6,115,171 A | * | 9/2000 | Minami et al. | .......... | 359/237 |
| 6,140,451 A | * | 10/2000 | Asai et al. | .......... | 528/34 |

FOREIGN PATENT DOCUMENTS

| | | | | |
|---|---|---|---|---|
| EP | 0218117 | | 9/1986 | |
| EP | 0218177 A | * | 4/1987 | .................. 528/18 |
| EP | 0218117 A2 | * | 4/1987 | .................. 528/18 |
| EP | 0890623 | | 3/1997 | |
| EP | 0775035 B | * | 5/1997 | .................. 528/18 |
| EP | 0775035 B1 | * | 5/1997 | .................. 528/18 |
| EP | 0992556 A1 | * | 4/2000 | |
| JP | 62-88327 | | 4/1987 | |
| JP | 63-16325 | | 1/1988 | |
| JP | 06-41518 | | 2/1994 | |
| JP | 6-41518 A | * | 2/1994 | .................. 510/522 |
| JP | 6-41518 B | * | 2/1994 | .................. 510/522 |
| JP | 06-100798 A | | 4/1994 | |
| JP | 6-100798 A | * | 4/1994 | .................. 528/18 |
| JP | 07-102214 A | * | 4/1995 | |
| JP | 7-258582 A | * | 10/1995 | .................. 528/18 |
| JP | 09315812 | | 12/1997 | |
| WO | WO 99/55789 | * | 11/1999 | |

* cited by examiner

Primary Examiner—Tom Dunn
Assistant Examiner—L. Edmondson
(74) Attorney, Agent, or Firm—Webb Ziesenheim Logsdon Orkin & Hanson, P.C.

(57) ABSTRACT

A coating liquid for forming a silica-based film having a low dielectric constant, as low as 3 or less, comprising (i) silica-based fine particles having phenyl groups and (ii) a polysiloxazane which can be produced by reacting hydrolyzate of an alkoxysilane represented by the formula $(X_nSi(OR^1)_{4-n})$ and/or hydrolyzate of a halogenated silane represented by the formula $(X_nSiX'_{4-n})$ with a polysilazane represented by $—(SiR^2R^4—NR^3)—_m$, or a coating-liquid for forming the silica-based film, comprising (i) silica-based fine particles having phenyl groups and (ii') an oxidatively decomposable resin with the weight ratio of the particles to the resin being in the range of 0.5 to 5.

22 Claims, No Drawings

COATING LIQUID FOR FORMING A SILICA-CONTAINING FILM WITH A LOW-DIELECTRIC CONSTANT AND SUBSTRATE COATED WITH SUCH A FILM

BACKGROUND OF THE INVENTION

The present invention relates to a coating liquid for forming a silica-containing film with a low dielectric constant which enables easily forming an insulating film having a dielectric constant (relative permittivity) as low as 3 or less and being excellent in microphotolithography workability, and relates to a substrate having a silica-containing film which exhibits the above properties.

In semiconductor devices with a multilayer wiring integrated at design rules of 0.3 micron or less, metal wiring impedance attributed to electrostatic induction is increased because of a narrow spacing between metal wiring layers required for the advanced integration of such semiconductor devices. Thus, a decrease of response speed and an increase of power consumption become problems to be resolved. For coping with this, it is necesary to minimize the dielectric constant of an interconnect insulating film disposed between a semiconductor substrate and a metal wiring layer such as an aluminum wiring layer or between metal wiring layers.

The interconnect insulating film disposed for the above purpose is generally formed on a substrate by a vapor phase growth method such as CVD method or by a coating method for forming an insulating coating film by use of a coating liquid.

However, it is believed that the dielectric constant of silica-containing film obtained by the vapor phase growth method such as the CVD method is 3.5 (in case of a fluorine-doped silica coating film) or higher, and forming a silica-containing film having a dielectric constant of lower than 3 is difficult.

On the other hand, the coating film containing a polyaryl resin, a fluorinated polyimide resin or a fluororesin, which is formed on a substrate by the CVD method or the coating method, exhibits a dielectric constant of about 2. However, these films have drawbacks in that not only the adherence to a substrate surface or to a resist material employed in its processing is poor, but also the resistance to chemicals and oxygen plasma is inferior.

The conventional coating liquid for forming a silica-containing film, which comprises a partial hydrolyzate of alkoxysilane, enables obtaining a coating film whose dielectric constant is about 2.5. However, the coating film has a drawback in that the adherence to a substrate surface is poor.

Some of the inventors of the present invention found that the coating film obtained from a coating liquid comprising a product of reaction between fine particles of silica and a halogenated silane or a hydrolyzate thereof exhibits a dielectric constant as low as 3 or less and is excellent in not only adherence to a substrate surface, mechanical strength and chemical resistance such as alkali resistance but also crack resistance. Based on such finding, a patent application was filed and published as Japanese Patent Laid-open Publication No. 9(1997)-315812.

The inventors of the present invention have made further studies. As a result, it has been found that, with respect to the above prior coating film, the deterioration in the properties of the coating film due to the plasma etching at a microphotolithography working stage or oxygen plasma irradiation at a resist peeling stage may cause adsorption (or re-adsorption) of moisture to the coating film, which results in an increase of the dielectric constant of the coating film and decreases of adherence, chemical resistance and crack resistance.

That is, it has been found that, when a silica-containing film is formed from the conventional coating liquid which contains, as a film forming component, a hydrolyzate of an alkoxysilane or a halogenated silane and fine particles of silica reacted therewith, the crosslinking density of Si—O—Si bond in the coating film is decreased by interstices or pores formed between the fine particles of silica and also by the organic group, fluorine atom and hydrogen atom bonded to the Si atom constituting the fine particles of silica. As a result, a coating film having a low dielectric constant can be obtained, however the above functional groups have poor plasma resistance by which the properties of the coating film are deteriorated at the time of microphotolithography working and hence a stable silica-containing film with a low dielectric constant would not be obtained.

SUMMARY OF THE INVENTION

The present invention has been made with a view to solving the above problems of the prior art. Accordingly, it is an object of the present invention to provide a coating liquid for forming a silica-containing film which enables forming an insulating film having a dielectric constant as low as 3 or less and being excellent in microphotolithography workability. It is another object of the present invention to provide a substrate furnished with a silica-containing film having the above properties.

The coating liquid for forming a silica-containing film with a low-dielectric constant according to the present invention comprises:

(i) fine particles of silica having a phenyl group thereon, and (ii) a polysiloxazane obtained by reacting a hydrolyzate or hydrolyzates of an alkoxysilane represented by the general formula (I) and/or a halogenated silane represented by the general formula (II) with a polysilazane represented by the general formula (III), each of the formulae is shown below:

$$X_nSi(OR^1)_{4-n} \tag{I}$$

$$X_nSiX'_{4-n} \tag{II, and}$$

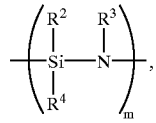
(III)

wherein X represents a hydrogen atom, a fluorine atom, an unfluorinated or fluorinated alkyl group having 1 to 8 carbon atoms, an aryl group or a vinyl group; each of $R^1$, $R^2$, $R^3$ and $R^4$ represents a hydrogen atom, an alkyl group having 1 to 8 carbon atoms, an aryl group or a vinyl group; X' represents a halogen atom; and m is an integer while n is an integer of 0 to 3.

Alternatively, the coating liquid for forming a silica-containing film with a low dielectric constant according to the present invention comprises:

(i) fine particles of silica having a phenyl group thereon, and (ii') an oxidatively decomposable resin, the weight ratio of the fine particles of silica having a phenyl group to the oxidatively decomposable resin (i.e., the fine particles/the resin) being in the range of 0.5 to 5.

This oxidatively decomposable resin is preferably a resin which is soluble in an organic solvent and which is decomposed by heating in a gas containing oxygen at room temperature to 500° C. or by irradiation with ultraviolet light, infrared rays, electron beams, X-rays or oxygen plasma.

It is preferred that the fine particles of silica having a phenyl group as mentioned above be obtained by the following steps:

i) hydrolyzing at least one alkoxysilane represented by the general formula (I) as shown below, and thereafter aging the hydrolyzed alkoxysilane, to thereby obtain fine particles of silica, and ii) bonding a hydrolyzate or hydrolyzates of an alkoxysilane having a phenyl group and/or a chlorosilane having a phenyl group with a surface of at least part of the obtained fine particles of silica:

$$X_n Si(OR^1)_{4-n} \qquad (I),$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; and n is an integer of 0 to 3.

The above alkoxysilane having a phenyl group is preferably represented by the general formula (IV), and the above chlorosilane having a phenyl group is preferably represented by the general formula (V), each of the formulae is shown below:

$$X_p R^2_q Si(OR^1)_{4-(p+q)} \qquad (IV),$$

and $$X_p R^2_q SiX'_{4-(p+q)} \qquad (V),$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; $R^2$ represents a phenyl group; X' represents a chlorine atom; and p is an integer of 0 to 3 and q is an integer of 1 to 3 provided that p+q is an integer of not greater than 4.

In obtaining the fine particles of silica from at least one alkoxysilane represented by the general formula (I) as shown above, the hydrolysis of the alkoxysilane and aging of the hydrolyzed alkoxysilane are preferably performed at 180° C. or higher.

The substrate according to the present invention has a silica-containing film with a low dielectric constant, which is formed from the above coating liquid.

DETAILED DESCRIPTION OF THE INVENTION

The first and second coating liquids for forming a silica-containing film with a low dielectric constant and the substrate coated with such a film according to the present invention will be described below in detail.

First Coating Liquid for Forming a Silica-Containing Film with a Low Dielectric Constant The first coating liquid for forming a silica-containing film with a low dielectric constant according to the present invention comprises (i) fine particles of silica having a phenyl group thereon and (ii) a polysiloxazane obtained by reacting a hydrolyzate or hydrolyzates of an alkoxysilane and/or a halogenated silane with a polysilazane.

(i) Fine Particles of Silica Having a Phenyl Group

The fine particles of silica having a phenyl group can be obtained by the following steps:

i) hydrolyzing, in the presence of water, an organic solvent and ammonia, at least one alkoxysilane represented by the general formula (I) as shown below, and thereafter optionally aging the hydrolyzed alkoxysilane, to thereby obtain fine particles of silica, and (ii) bonding at least one member selected from among alkoxysilanes having a phenyl group and/or chlorosilanes having a phenyl group with the obtained fine particles of silica:

$$X_n Si(OR^1)_{4-n} \qquad (I),$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; and n is an integer of 0 to 3.

Examples of suitable alkoxysilanes represented by the general formula (I) include tetramethoxysilane, tetraethoxysilane, tetraisopropoxysilane, tetrabutoxysilane, tetraoctoxysilane, methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane and trifluoromethyltriethoxysilane.

The organic solvent is selected from among, for example, alcohols such as methanol, ethanol, propanol and butanol, ketones such as methyl ethyl ketone and methyl isobutyl ketone, glycol ethers such as methyl cellosolve, ethyl cellosolve and propylene glycol monopropyl ether, glycols such as ethylene glycol, propylene glycol and hexylene glycol and esters such as methyl acetate, ethyl acetate, methyl lactate and ethyl lactate.

As the catalyst, ammonia is preferably used. However, other basic compounds such as amines, alkali metal hydrides, quaternary ammonium compounds and amine coupling agents can be used.

The conventional methods can be employed for the production of the fine particles of silica. Specifically, the method for producing the fine particles of silica may comprise a mixing stage at which an alkoxysilane and aqueous ammonia are added slowly to a solvent composed of water and alcohol under agitation, so as to effect a hydrolysis reaction of the alkoxysilane.

At the reaction, it is preferred that water be present in an amount of 0.5 to 50 mol, especially 1 to 25 mol, per mol of the group Si—OR$^1$ as a constituent of the alkoxysilane. On the other hand, ammonia is preferably added in an amount of 0.01 to 1 mol, still preferably 0.05 to 0.8 mol per mol, in terms of SiO$_2$, of the alkoxysilane.

The hydrolysis and/or polycondensation reaction of the alkoxysilane is preferably performed in a heat-resistant and pressure-resistant vessel such as an autoclave at a temperature of 180° C. or higher, especially 200° C. or higher. The hydrolysis and/or polycondensation reaction may be followed by aging conducted at the same temperature or higher temperatures. The higher the reaction temperature and/or aging temperature, the further the polycondensation of alkoxysilane is promoted and then the fine particles of silica are densified at the inside thereof. When the hydrolysis reaction and aging are carried out at such temperatures, the fine particles of silica are highly densified, whereby the moisture adsorptivity of the fine particles per se is lowered and the amount of functional groups remaining on the particle surface is reduced.

Alternatively, the formation and growth of fine particles of silica may be carried out by adding a high-boiling-point solvent such as ethylene glycol to, for example, a solvent composed of a mixture of water and alcohol under agitation and conducting the hydrolysis of alkoxysilane. When such a high-boiling-point solvent is present at the hydrolysis of alkoxysilane, a transesterification reaction of alkoxy group is realized so that the high-boiling-point solvent is captured in the internal part of the fine particles of silica, thereby obtaining fine particles of a low-density porous silica.

Moreover, in the present invention, silica sol obtained by subjecting an alkali metal silicate or the like to an ion exchange or a hydrolysis can be used as the fine particles of silica for the present invention. Further, fine particles composed of a porous zeolite obtained by removing aluminum from a zeolite composed of an aluminosilicate can also be used for the present invention.

The average particle size of the above fine particles of silica is preferably in the range of 30 to 1000 Å, still preferably 50 to 500 Å. As far as the average particle size is in these ranges, the fine particles of silica may be either those of uniform particle diameter or a mixture of at least two types of fine particles having different particle diameters. When the particle size is less than 30 Å, it is difficult for the silica-containing film obtained by use of the coating liquid produced from such fine particles, to give a lower dielectric constant. On the other hand, when the particle size exceeds 1000 Å, problems are likely to occur at the time of processing at a microphotolithography stage.

The shape of the fine particles of silica may be either spherical or heteromorphous.

The fine particles of silica having a phenyl group for use in the present invention can be obtained by reacting the above fine particles of silica with an alkoxysilane having a phenyl group and/or a chlorosilane having a phenyl group. The above alkoxysilane having a phenyl group can be represented by the general formula (IV), and the chlorosilane having a phenyl group can be represented by the general formula (V), each of the formulae is shown below:

   (IV), and

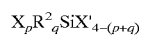   (V).

In the formulae, X represents a hydrogen atom, a fluorine atom, an unfluorinated or fluorinated alkyl group having 1 to 8 carbon atoms, an aryl group or a vinyl group; R$^1$ represents a hydrogen atom, an alkyl group having 1 to 8 carbon atoms, an aryl group or a vinyl group; R$^2$ represents a phenyl group; and X' represents a chlorine atom. The phenyl group R$^2$ may be partly substituted with an alkyl group having 1 to 8 carbon atoms.

p is an integer of 0 to 3 and q is an integer of 1 to 3 provided that the sum of p and q is an integer of not greater than 4.

The above alkoxysilane and chlorosilane can be selected from among, for example, phenyltrimethoxysilane, phenyltriethoxysilane, phenyltriacetoxysilane, phenylmethyldimethoxysilane, phenylmethyldiethoxysilane, phenyldimethylethoxysilane, phenyldimethylacetoxysilane, phenyltrichlorosilane, phenylmethyldichlorosilane, phenylethyldichlorosilane, phenyldimethylchlorosilane, phenylmethylchlorosilane and phenyldichlorosilane.

In the present invention, the above alkoxysilane having a phenyl group and/or chlorosilane having a phenyl group may be used in the form of a hydrolyzate.

In the reaction of the fine particles of silica with the alkoxysilane having a phenyl group and/or chlorosilane having a phenyl group, neither growth of the fine particles of silica nor formation of new fine particles of silica does occur, and a surface reaction of the fine particles of silica with the alkoxysilane having a phenyl group and/or chlorosilane having a phenyl group occurs on surfaces of the fine particles of silica. Thus, the fine particles of silica having a phenyl group thereon can be obtained.

The fine particles of silica having a phenyl group for use in the present invention can be obtained by mixing the fine particles of silica obtained in the above manner with at least one member selected from among the alkoxysilanes having a phenyl group and chlorosilanes having a phenyl group and by carrying out a reaction between them. The mixing ratio, in terms of SiO$_2$, of the alkoxysilane having a phenyl group and/or chlorosilane having a phenyl group is preferably in the range of 0.01 to 0.3 part by weight, still preferably 0.05 to 0.2 part by weight, per part by weight of the fine particles of silica.

When the amount of the alkoxysilane having a phenyl group and/or chlorosilane having a phenyl group is less than 0.01 part by weight, the amount of phenyl group present on the surface of the fine particles of silica is so small that the silica-containing film formed on a substrate tends to exhibit poor oxidation resistance and to have high moisture adsorptivity. On the other hand, when the amount of the alkoxysilane having a phenyl group and/or chlorosilane having a phenyl group is greater than 0.3 part by weight, excess alkoxysilane having a phenyl group or excess chlorosilane having a phenyl group which does not participate in the surface reaction with the fine particles of silica remains, with the result that the silica-containing film obtained by use of the coating liquid produced therefrom is likely to be poor in adherence to a substrate surface, mechanical strength, coatability, etc.

Water, an organic solvent and a catalyst are generally used in the reaction of the fine particles of silica with the alkoxysilane having a phenyl group and/or chlorosilane having a phenyl group for producing the fine particles of a silica having a phenyl group.

It is appropriate to use at least 0.1 mol of water per mol of Si—OR$^1$ as a constituent of the alkoxysilane having a phenyl group and/or per mol of Si—X' as a constituent of the chlorosilane having a phenyl group.

As the organic solvent, the same organic solvents as employed in the above preparation of the fine particles of silica can be used in this reaction as well.

As the catalyst, not only the same catalysts as employed in the above preparation of the fine particles of silica but also acid catalysts can be used in this reaction. For example, inorganic acids such as hydrochloric acid, nitric acid and sulfuric acid, organic acids such as acetic acid, oxalic acid and toluenesulfonic acid, and compounds exhibiting acidity in an aqueous solution such as metallic soap can be used. However, it is preferred to employ basic catalysts.

After the mixing of the fine particles of silica, alkoxysilane having a phenyl group and/or chlorosilane having a phenyl group, water, an organic solvent and a catalyst, the mixture is heated at about 100° C. or below, preferably 80° C. or below. The heating is generally performed for 0.5 to 50 hr, preferably 0.5 to 15 hr, depending on temperature conditions, etc.

This heating enables bonding a hydrolyzate of the alkoxysilane having a phenyl group and/or chlorosilane having a phenyl group with at least part of the surface of the fine particles of silica, so that the fine particles of silica having a phenyl group can be obtained.

The thus obtained unpurified fine particles of silica having a phenyl group, although they can directly be used, preferably undergo a solvent replacement in which the water/organic solvent contained as a dispersion medium is replaced by an organic solvent by, for example, ultrafiltration or distillation, prior to subjecting to a reaction with a polysiloxazane as described below.

(ii) Polysiloxazane

The polysiloxazane (ii) for use in the present invention is a product of reaction between a hydrolyzate or hydrolyzates of alkoxysilane and/or halogenated silane (ii-1) and a polysilazane (ii-2).

(ii-1) Hydrolyzate or Hydrolyzates of Alkoxysilane and/or Halogenated Silane

In the present invention, as a component for forming a polysiloxazane, it is proposed to use a hydrolyzate or hydrolyzates of an alkoxysilane represented by the general formula (I) and/or a halogenated silane represented by the general formula (II), each of the formulae is shown below:

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; X' represents a halogen atom; and n is an integer of 0 to 3.

The same alkoxysilanes as mentioned in the above preparation of the fine particles of silica can be used as the alkoxysilane represented by the general formula (I).

For example, trichlorosilane, tribromosilane, dichlorosilane, fluorotrichlorosilane and fluorotribromosilane can be used as the halogenated silane represented by the general formula (II).

The hydrolyzate for use in the present invention can be obtained by performing a hydrolysis and/or polycondensation of an alkoxysilane represented by the general formula (I) and/or a halogenated silane represented by the general formula (II) in the presence of water, an organic solvent and a catalyst. This hydrolysis and/or polycondensation can be effected by the customary procedure.

The organic solvent can be selected from among, for example, alcohols such as methanol, ethanol, propanol and butanol, ketones such as methyl ethyl ketone and methyl isobutyl ketone, glycol ethers such as methyl cellosolve, ethyl cellosolve and propylene glycol monopropyl ether, glycols such as ethylene glycol, propylene glycol and hexylene glycol and esters such as methyl acetate, ethyl acetate, methyl lactate and ethyl lactate.

The catalyst is selected from among, for example, inorganic acids such as hydrochloric acid, nitric acid and sulfuric acid, organic acids such as acetic acid, oxalic acid and toluenesulfonic acid, compounds exhibiting acidity in an aqueous solution such as metallic soap, and basic compounds such as ammonia, amines, alkali metal hydrides, quaternary ammonium compounds and amine coupling agents.

The water needed in the hydrolysis reaction is preferably used in an amount of 0.1 to 5 mol, still preferably 0.1 to 2 mol, per mol of Si—$OR^1$ group as a constituent of alkoxysilane and/or mol of Si—X' group as a constituent of halogenated silane. The catalyst is preferably added in an amount of 0.001 to 1 mol per mol of alkoxysilane and/or halogenated silane.

Although the reaction conditions for hydrolysis are not particularly limited, it is preferred that, in the hydrolysis of alkoxysilane, the reaction be performed at 0 to 80° C., especially 5 to 60° C., for a period of 0.1 to 10 hr, especially 1 to 5 hr. In the hydrolysis of halogenated silane, it is preferred that the reaction be performed at 0 to 50° C., especially 5 to 20° C., for a period of 0.1 to 20 hr, especially 1 to 10 hr.

The number average molecular weight of the thus obtained hydrolyzate is preferably in the range of 100 to 50,000, still preferably 500 to 10,000 (molecular weight in terms of polystyrene).

In the use of alkoxysilane hydrolyzate, the alkoxysilane may be either identical with or different from that employed in the above preparation of the fine particles of silica.

(ii-2) Polysilazane

In the present invention, it is proposed to use a polysilazane represented by the general formula (III) as shown below:

wherein each of $R^2$, $R^3$ and $R^4$ represents a hydrogen atom, an alkyl group having 1 to 8 carbon atoms, an aryl group or a vinyl group; and m is an integer.

Inorganic polysilazanes of the formula (III) wherein all of $R^2$, $R^3$ and $R^4$ represent hydrogen atoms, containing silicon atoms, nitrogen atoms and hydrogen atoms in respective amounts of 55–65% by weight, 20–30% by weight and 10–15% by weight per molecule, are especially preferred.

It is preferred that the ratio of Si atoms to N atoms (Si/N ratio) in each polysilazane be in the range of 1.0 to 1.3.

These inorganic polysilazanes can be produced by the conventional methods, including the method in which a dihalosilane is reacted with a base to thereby form a dihalosilane adduct and the adduct is reacted with ammonia (see Japanese Patent Publication No. 63(1988)-16325) and the method in which, for example, methylphenyldichlorosilane or dimethyldichlorosilane is reacted with ammonia (see Japanese Patent Laid-open Publication No. 62(1987)-88327).

The polysilazane having a repeating unit of the above formula (III) may be in linear or cyclic form, or a mixture of linear polysilazane and cyclic polysilazane.

The number average molecular weight of these polysilazanes is preferably in the range of 100 to 10,000, still preferably 500 to 2000 (molecular weight in terms of polystyrene).

Preparation of Polysiloxazane (ii)

The polysiloxazane (ii) for use in the present invention can be obtained by mixing together the above hydrolyzate or hydrolyzates of alkoxysilane and/or halogenated silane (ii-1) and polysilazane (ii-2) in an organic solvent and by carrying out a reaction between them.

The organic solvent is not limited if the hydrolyzate of alkoxysilane or halogenated silane and the polysilazane can be dissolved therein. For example, ketones such as methyl ethyl ketone and methyl isobutyl ketone, aromatic hydrocarbons such as toluene, xylene and mesitylene can be used.

With respect to the mixing of the hydrolyzate of alkoxysilane and/or halogenated silane with the polysilazane, the amount of hydrolyzate of alkoxysilane and/or halogenated silane is preferably in the range of 91 to 99% by weight while the amount of polysilazane is preferably in the range of 1% to 9% by weight. When the amount of polysilazane is greater than 9% by weight, Si—N bonds are likely to remain in the silica-containing film obtained by use of the coating liquid produced therefrom, with the result that an increase of dielectric constant thereof may be caused. On the other hand, when the amount of polysilazane is less than 1% by weight, the silica-containing film may be poor in adherence to a substrate surface, mechanical strength and chemical resistance such as alkali resistance.

Although the conditions of reaction between the hydrolyzate or hydrolyzates of alkoxysilane and/or halogenated silane (ii-1) and the polysilazane (ii-2) are not particularly limited, it is generally preferred that a mixture of the hydrolyzate or hydrolyzates of alkoxysilane and/or halogenated silane (ii-1) and the polysilazane (ii-2) be heated at about 100° C. or below, especially 80° C. or below for 0.5 to 5 hr, especially 0.5 to 3 hr.

This reaction produces a polysiloxazane (ii) comprising polysilazane bonded to a part of the hydrolyzate or hydrolyzates of alkoxysilane and/or halogenated silane at the end of the chains. The number average molecular weight of the thus obtained polysiloxazane (ii) (in terms of polystyrene) is preferably in the range of 100 to 50,000, still preferably 500 to 10,000.

Preparation of Coating Liquid for Forming a Silica-containing Film with a Low Dielectric Constant The first coating liquid for forming a silica-containing film with a low dielectric constant according to the present invention is prepared by mixing a dispersion of the above fine particles of silica having a phenyl group (i) and polysiloxazane (ii) optionally together with a solvent added thereto and heating them so that the fine particles of silica having a phenyl group (i) are reacted with the polysiloxazane (ii).

The mixing proportion of the fine particles of silica having a phenyl group (i) to the polysiloxazane (ii) is not limited if the polysiloxazane is added in an amount sufficient to effect bonding of the polysiloxazane with a surface of at least one part of the fine particles of silica having a phenyl group (i). However, it is preferred that the mixing and reaction be performed at a proportion such that the weight ratio of the fine particles of silica having a phenyl group to the polysiloxazane (i.e., the fine particles/the polysiloxazane) falls within the range of 0.1 to 20, especially 0.5 to 10.

When the above weight ratio exceeds 20, the silica-containing film becomes more porous in dependence on an increased number of interstices or pores formed between the fine particles of silica having a phenyl group and the adherence to a substrate surface, mechanical strength and capability of planarizing a substrate surface tend to be inferior, although lowering of a dielectric constant is expected. On the other hand, when the above weight ratio is less than 0.1, it may occur that lowering of the dielectric constant of the silica-containing film obtained in the same manner is prevented because the interstices or pores formed between the fine particles of silica having a phenyl group are buried by the polysiloxazane.

The heating is preferably performed at about 100° C. or below, still preferably 80° C. or below for about 0.5 to 5 hr, still preferably 0.5 to 3 hr.

This heating induces a reaction between the polysiloxazane (ii) and the surface of the fine particles of silica having a phenyl group (i). During this reaction, neither growth of fine particles of silica nor formation of new fine particles of silica occurs and the polysiloxazane is in part or in whole bonded with the surface of the fine particles of silica having a phenyl group.

The thus produced first coating liquid for forming a silica-containing film with a low dielectric constant according to the present invention preferably contains solid components (total of fine particles of silica and polysiloxazane) in an amount of 5 to 40% by weight, still preferably 10 to 30% by weight.

The coating liquid for forming a silica-containing film with a low dielectric constant which is obtained in the above manner may be subjected first to a replacement with a solvent such as methyl isobutyl ketone conducted by the use of, for example, a rotary evaporator so that the alcohols and water formed in the above reaction are completely removed and thereafter to a concentration adjustment so as to attain the above contents of solid components.

The above first coating liquid for forming a silica-containing film with a low dielectric constant according to the present invention contains fine particles of silica having a phenyl group as a film-forming component, so that the coating film can be rendered porous by the interstices or pores formed between the fine particles of silica having a phenyl group. Moreover, the phenyl group on the surface of the fine particles of silica not only exerts an effect of preventing adsorption of moisture into the interstices or pores formed in the obtained coating film but also exhibits a property of enhancing an oxygen plasma resistance.

Thus, the silica-containing film with a low dielectric constant obtained from the coating liquid in which a product of reaction between the fine particles of silica having a phenyl group and the polysiloxazane is contained enables inhibiting the deterioration of the film quality by plasma etching during microphotolithography working or by oxygen plasma during resist peeling. Further, the above moisture adsorption into the interstices or void spaces formed in the coating film can be inhibited. Therefore, there can be formed a stable silica-containing film, which exhibits a dielectric constant as low as 3 or less, which is excellent in adherence to a substrate surface, chemical resistance such as alkali resistance and crack resistance, and which exhibits excellent planarizing performance. Also, the use of the coating liquid for forming a silica-containing film with a low dielectric constant according to the present invention enables enhancing a yield of products with no defects of conductivity in the manufacturing of semiconductor devices.

Second Coating Liquid for Forming a Silica-containing Film with a Low Dielectric Constant The second coating liquid for forming a silica-containing film with a low dielectric constant according to the present invention comprises:

(i) fine particles of silica having a phenyl group thereon, and (ii') an oxidatively decomposable resin, the weight ratio of the fine particles of silica having a phenyl group to the oxidatively decomposable resin (i.e., the fine particles/the resin) being in the range of 0.5 to 5. The fine particles of silica having a phenyl group (i) are prepared in the same manner as mentioned above.

(ii') Oxidatively Decomposable Resin

The oxidatively decomposable resin is not limited if it is a resin soluble in an organic solvent, which resin has a property of being decomposed by heating in a gas containing oxygen at room temperature to 500° C. or by irradiation with, for example, ultraviolet light, infrared rays, electron beams, X-rays or oxygen plasma. Examples of suitable oxidatively decomposable resins include cellulose resins, polyamide resins, polyester resins, acrylic resins, polyether resins, polyolefin resins, polyol resins and epoxy resins.

Of these resins, cellulose resins and acrylic resins whose residual carbon ratios are lower than others are especially preferred.

The number average molecular weight of these oxidatively decomposable resins is preferably in the range of 100 to 50,000, still preferably 500 to 10,000 (molecular weight in terms of polystyrene).

Preparation of Coating Liquid for Forming a Silica-containing Film with a Low Dielectric Constant The second coating liquid for forming a silica-containing film according to the present invention can be obtained by mixing the fine particles of silica having a phenyl group obtained in the above manner with an oxidatively decomposable resin. Although the fine particles of silica having a phenyl group obtained in the above manner can be directly used as they are unpurified, it is preferred that the water and an organic solvent contained as a dispersion medium be replaced by an organic solvent through ultrafiltration, distillation or other means prior to the mixing of the fine particle of silica having a phenyl group and the oxidatively decomposable resin.

With respect to the coating liquid for forming a silica-containing film with a low dielectric constant for use in the present invention, the fine particles of silica having a phenyl group obtained in the above manner are mixed with the oxidatively decomposable resin so that the oxidatively decomposable resin is bound with at least a part of the fine particles of silica having a phenyl group. It is preferred that the mixing and binding be effected at such a proportion that the weight ratio of the fine particles of silica having a phenyl group (A) to the oxidatively decomposable resin (B) (i.e., the fine particles/the resin) falls within the range of 0.5 to 5, especially 1 to 4.

When the weight ratio of (A)/(B) is greater than 5 (that is, the amount of component (A) is too large), the silica-containing film obtained by use of the coating liquid produced therefrom tends to have an increased number of interstices or pores formed between the fine particles of silica having a phenyl group. As a result, it becomes so porous that the strength of the silica-containing film and the adherence to a multi-layer film formed by CVD method or sputtering method in the subsequent process are decreased to an unfavorable degree. On the other hand, when the weight ratio of (A)/(B) is less than 0.5 (that is, the amount of component (B) is too large), the content of the oxidatively decomposable resin which is decomposed at the heating or irradiation stage as mentioned hereinbelow, is so large that the porous silica-containing film obtained suffers from shrinkage and exhibits poor adherence to a substrate surface and unsatisfactory mechanical strength.

The fine particles of silica having a phenyl group and oxidatively decomposable resin are heated at about 100° C. or below, preferably about 80° C. or below, after the mixing thereof. This heating is generally performed for a period of 0.5 to 5 hr, preferably 0.5 to 3 hr, depending on the temperature conditions, etc.

The second coating liquid for forming a silica-containing film with a low dielectric constant according to the present invention, in which the oxidatively decomposable resin is in part or in whole binded with surfaces of the fine particles of silica having a phenyl group, can be obtained by this heating.

The second coating liquid for forming a silica-containing film according to the present invention may further contain the above alkoxysilane represented by the general formula (I) and/or halogenated silane represented by the general formula (II), hydrolyzates thereof and/or polysiloxazanes obtained by reacting the said hydrolyzates and polysilazane represented by the general formula (III) in addition to the fine particles of silica having a phenyl group and oxidatively decomposable resin, each of the formulae is shown above.

The weight ratio of these other components in terms of $SiO_2$ is preferably 0.3 or less, still preferably 0.2 or less, per part by weight of the fine particles of silica having a phenyl group.

The silica-containing film with a low dielectric constant is generally produced from the above coating liquid by a process with the following two steps.

First, the coating liquid for forming a silica-containing film is applied to a substrate surface and then heated to thereby form a coating film.

Second, the substrate with such a coating film is subjected to a microphotolithography stage to thereby carry out formation of a pattern of wiring, via holes, etc. and formation of a multi-layer films, and then the oxidatively decomposable resin contained as a binding component is decomposed by heating in a gas containing oxygen at room temperature to 500° C. or by irradiation with, for example, ultraviolet light, infrared rays, electron beams, X-rays or oxygen plasma.

As a result or the film formation made through the above process, the portion of oxidatively decomposable resin contained in the coating film together with the fine particles of silica having a phenyl group is decomposed and makes pores or void spaces, by which a silica-containing film with a low dielectric constant is obtained. On the other hand, the phenyl group bonded to the surface of the fine particles of silica has high resistance against heat, since it remains present on the surface without being oxidized at the time of decomposition of the oxidatively decomposable resin. This phenyl group, as mentioned hereinabove, has a moisture repellency to thereby exert an effect of inhibiting the adsorption of moisture into pores or void spaces formed between the fine particles of silica having a phenyl group. Furthermore, the phenyl group exhibits a property of being highly resistant to oxygen plasma.

Therefore, the use of the second coating liquid for forming a silica-containing film with a low dielectric constant according to the present invention, like the use of the first coating liquid enables forming a stable silica-containing film which exhibits a low dielectric constant as low as 3 or less and is excellent in not only adherence to a substrate surface, chemical resistance (such as alkali resistance) and crack resistance but also planarizing performance.

Moreover, the use of this coating liquid according to the present invention enables enhancing a yield of products with no defects of conductivity in the manufacturing of semiconductor devices.

Substrate Coated with a Silica-Containing Film with a Low Dielectric Constant

The substrate coated with a silica-containing film according to the present invention can be obtained by applying to a surface of any of various substrates the first or second coating liquid as mentioned hereinabove and then subjecting it to a heating or irradiation stage.

The coating on the substrate with the coating liquid can be conducted by the use of any of the customary techniques such as the spray method, spin coating method, dip coating method, roll coating method and transfer printing method. The above coating is normally followed by heating, which is generally conducted at 80 to 450° C., preferably 150 to 400° C. Specifically, in the use of the first coating liquid for forming a silica-containing film with a low dielectric constant, the heating is preferably conducted at 300 to 450° C., still preferably 350 to 400° C. In the use of the second coating liquid for forming a silica-containing film with a low dielectric constant, the heating is preferably conducted at 80 to 400° C., still preferably 150 to 300° C. because decomposition of the oxidatively decomposable resin is carried out as the later stage of the above-mentioned two steps. It is preferred that the heating be conducted in an atmosphere of inert gas such as nitrogen.

This heating not only promotes the polymerization of components of the coating liquid to thereby effect curing thereof but also lowers the melt viscosity of polymerized components to thereby increase the reflow property of a silica-containing film with the result that the planarity of the thus obtained coating film is enhanced.

The above coating liquid for forming a silica-containing film according to the present invention maintains the reflow property attributed to low viscosity up to about 250° C. Thus, a coating film with highly enhanced planarity can be obtained.

Although it is varied depending on the substrate to be coated and its target, the thickness of the silica-containing film formed in the above manner generally ranges from about 1000 to 2500 Å in the formation on a silicon substrate of a semiconductor device and generally ranges from 3000 to 5000 Å in the formation between wiring layers of a multilayer wiring.

When use is made of the second coating liquid for forming a silica-containing film with a low dielectric constant, after applying the coating liquid to the substrate and heating thereof, the oxidatively decomposable resin contained as a binding component may be decomposed by heating in a gas containing oxygen at room temperature to 500° C. or by irradiation with, for example, ultraviolet light, infrared rays, electron beams, X-rays or oxygen plasma. Prior to the decomposition of the oxidatively decomposable resin as a binding component by heating in a gas containing oxygen at room temperature to 500° C. or by irradiation with, for example, ultraviolet light, infrared rays, electron beams, X-rays or oxygen plasma, the coating film may be subjected to the microphotolithography stage to thereby carry out formation of a pattern of wiring, via holes, etc. and formation of a multi-layer film. This procedure enables avoiding the problem of moisture adsorption during the microphotolithography working, which problem is the drawback of porous coating films, and thus enables forming a silica-containing film with a dielectric constant.

The above substrate coated with a silica-containing film with a low dielectric constant according to the present invention is used in, for example, a semiconductor device, a liquid crystal display or a photomask with a phase shifter. Specifically, in the semiconductor device, the coating film with a low dielectric constant as low as 3 or less is formed, for example, on a silicon substrate, on a part between wiring layers of a multilayer wiring structure, on an element surface or on a PN junction part.

A coating film such as an insulating film whose dielectric constant is as low as 3 or less and which is excellent in microphotolithography workability, chemical resistance (e.g., alkali resistance) and crack resistance can be obtained by the use of the above coating liquid for forming a silica-containing film with a low dielectric constant according to the present invention.

EXAMPLE

The present invention will now be illustrated with reference to the following Examples, which in no way limit the scope of the invention.

Production Example

1. Preparation of the Fine Particles of Silica Having a Phenyl Group:

(1) To a solution consisting of a mixture of 139.1 g of pure water and 169.9 g of methanol which is being kept at 60° C., 2982.5 g of a water/methanol solution of tetraethoxysilane (Ethyl Silicate 28 produced by Tama Chemicals Co., Ltd.) which is a mixture of 490 g of pure water, 1960 g of methanol and 532.5 g of tetraethoxysilane dissolved therein, and 596.4 g of a 0.25% aqueous ammonia by weight were simultaneously added under agitation over a period of 52 hr. After the completion of the addition, the mixture was aged at the same temperature for 3 hr. Thereafter, unreacted tetraethoxysilane, methanol and ammonia were removed by ultrafiltration, followed by addition of pure water, to thereby effect its purification. The silica content was regulated to 5% by weight. A polycondensation reaction was carried out in an autoclave at 300° C. for 10 hr. After the reaction, the mixture was purified with the use of amphoteric ion exchange resin (AG-501 produced by Bio-Rad). Thus, a dispersion of fine particles of silica having an average diameter of 300 Å (A) was obtained.

(2) A dispersion of porous fine particles of silica having an average diameter of 250 Å (B) was prepared under the same conditions as in the preparation of the dispersion of the fine particles of silica (A) except that a solution consisting of a mixture of 139.1 g of pure water, 140 g of methanol and 29.9 g of ethylene glycol was used.

(3) The concentration of the above dispersion (A) was adjusted to 5% by weight, and a 5 to 10-fold amount of ethanol was added to the dispersion. Subsequently, a solvent replacement was carried out by means of a rotary evaporator so as to prepare with an adjustment an ethanol dispersion essentially consisting of 5% by weight of solid components, 5% by weight of water and balance of ethanol. Thereafter, phenyltrimethoxysilane as an alkoxysilane having a phenyl group was added in an amount of 10% by weight, in terms of $SiO_2$, based on the weight of fine particles of silica, and the pH value of the mixture was adjusted to 10 by adding a 1% aqueous ammonia by weight into the mixture. After the phenyltrimethoxysilane and the fine particles of silica contained in the mixture were reacted at 50° C. for 15 hr, a 10-fold amount of MIBK (methyl isobutyl ketone) was added. A solvent replacement by means of a rotary evaporator was performed, thereby obtaining a MIBK dispersion essentially consisting of 5% by weight of solid components, 0.5% by weight of water and the balance of MIBK (C).

(4) The concentration of the above dispersion (B) was adjusted to 5% by weight, and a 5 to 10-fold amount of ethanol was added to the dispersion. Subsequently, a solvent replacement was carried out by means of a rotary evaporator so as to prepare with an adjustment an ethanol dispersion essentially consisting of 5% by weight of solid components, 5% by weight of water and balance of ethanol. Thereafter, phenyltrimethoxysilane as an alkoxysilane having a phenyl group was added in an amount of 10% by weight, in terms of $SiO_2$, based on the weight of fine particles of silica, and the pH value of the mixture was adjusted to 10 by adding 1% aqueous ammonia by weight into the mixture. After the phenyltrimethoxysilane and the fine particles of silica contained in the mixture were reacted at 50° C. for 15 hr, a 10-fold amount of MIBK (methyl isobutyl ketone) was added. A solvent replacement by means of a rotary evaporator was performed, thereby obtaining a MIBK dispersion essentially consisting of 5% by weight of solid components, 0.5% by weight of water and the balance of MIBK (D).

2. Preparation of Polysiloxazane (1) Preparation of Hydrolyzate of Alkoxysilane or Halogenated Silane Trichlorosilane was hydrolyzed in toluene in the presence of a catalyst of toluenesulfonic acid hydrate in accordance with the process described in Japanese Patent Publication No. 6(1994)-41518, thereby obtaining a hydrogensilsesquioxane polymer having a number average molecular weight of 3500.

(2) Preparation of Polysilazane

Polysilazane was produced in accordance with the process described in Japanese Patent Publication No. 63(1988)-16325, the outline of which is as follows.

600 ml of pyridine was placed in a reactor arranged in a thermostatic chamber controlled at 0° C., and 28.3 g of dichlorosilane was added thereto under agitation to thereby obtain a complex compound thereof (i.e., pyridine adduct). Ammonia gas was added thereinto for a period of 2 hr until the molar amount of ammonia ($NH_3$) reaches 15 times that of dichlorosilane, thereby obtaining a solution containing a reaction product. Precipitation was carried out, and the resultant precipitate was filtered off. The filtrate was brought to vacuum, and the solvent was replaced with xylene. Thus, there was obtained a solution containing polysilazane having a number average molecular weight of 800 in a concentration of 5% by weight.

(3) Preparation of Polysiloxazane

The thus obtained hydrogensilsesquioxane polymer was dissolved in MIBK to thereby obtain a 5% solution by weight of hydrogensilsesquioxane polymer. The polysilazane solution was added thereto over a period of 3 hr. After the hydrogensilsesquioxane and the polysiloxane contained in the mixture were reacted at 50° C. for 5 hr, the solvent was replaced with MIBK by means of a rotary evaporator. Thus, there was obtained a solution containing polysiloxane having a number average molecular weight of 4000 in a concentration of 5% by weight.

3. Preparation of Coating Liquid for Forming a Silica-containing Film with a Low Dielectric Constant The thus obtained fine particles of silica having a phenyl group (C) and (D) were mixed respectively with polysiloxazane in the weight ratios specified in Table 1 and then heated at 50° C. for 1 hr. Thereafter, a solvent replacement with methyl isobutyl ketone by means of a rotary evaporator was performed once more to thereby completely remove water and alcohols produced by heating. Thus, there were obtained the coating liquids (1) to (4), having a solid concentration of 20% by weight.

For comparison, the fine particles of silica having no phenyl group (A) and (B) were reacted respectively with polysiloxazane in the similar manner, thereby obtaining the coating liquids (5) and (6) having a solid concentration of 20% by weight.

Moreover, the obtained fine particles of silica having a phenyl group (C) were mixed with an ethanol solution of ethylcellulose in the weight ratios specified in Table 1 and then heated at 50° C. for 1 hr. Thereafter, a solvent replacement with methyl isobutyl ketone by means of a rotary evaporator was performed once more to thereby completely remove water and alcohols produced by heating. Thus, there were obtained the coating liquids (7) to (11), having a solid concentration of 20% by weight.

The compositions of the obtained coating liquids are described in Table 1.

TABLE 1

| Coating liquid | Fine particles of silica used | weight ratio fine particles/ polysiloxazane | fine particles/ ethylcellulose |
|---|---|---|---|
| (1) | (C) | 2/1 | — |
| (2) | (C) | 4/1 | — |
| (3) | (D) | 2/1 | — |
| (4) | (D) | 4/1 | — |
| (5) | (A) | 2/1 | — |
| (6) | (B) | 2/1 | — |
| (7) | (C) | — | 1/4 |
| (8) | (C) | — | 1/1 |
| (9) | (C) | — | 2/1 |
| (10) | (C) | — | 9/1 |
| (11) | (C) | — | 10/0 |

N.B.
(A): Fine particles of silica having no phenyl group
(B): Porous fine particles of silica having no phenyl group
(C): Fine particles of silica having a phenyl group
(D): Porous fine particles of silica having a phenyl group Examples 1 to 4 and Comparative Examples 1 and 2

Each of the coating liquids (1) to (6) was applied by the spin coating method to a test piece of semiconductor substrate with a multi-layer wiring integrated at the design rule of $0.25\mu$ and heated at 250° C. for 3 min for drying. Thereafter, heating was conducted in a nitrogen gas at 400° C. for 30 min, thereby obtaining a silica-containing film with the same thickness of 5000 Å. Furthermore, a $SiO_2$ film with a thickness of 4000 Å was formed on each of these coating films by the plasma CVD method, and wiring height differences were planarized by the CMP (Chemical Mechanical Polishing) method. Then, a normal microphotolithography was carried out thereto to thereby form via holes, followed by oxygen plasma irradiation so that remaining resists were removed. The resultant substrate with a via hole was washed with an organic amine and water. Barrier metals of TiN were formed by the sputtering technique, and W plugs were formed by the CVD and CMP techniques to thereby provide vias. Thereafter, top-layer metal wirings were formed, thereby obtaining semiconductor devices.

With respect to each of the thus obtained semiconductor devices having a 100 continuous vias, the dielectric constant of the silica-containing film and the yield of the semiconductor devices with no defects of conductivity were measured.

The dielectric constant was calculated from the C-V measurement between wirings adjacent to each other, and the yield of the semiconductor devices was evaluated by the measurement of wiring resistance.

The results are shown in Table 2.

TABLE 2

| Example | Coating liquid | Dielectric Constant | Yield of semiconductor devices with no defects (%) |
|---|---|---|---|
| Example 1 | (1) | 2.4 | 99.9 |
| Example 2 | (2) | 2.1 | 99.9 |
| Example 3 | (3) | 2.2 | 99.9 |
| Example 4 | (4) | 1.8 | 99.9 |
| Comp. Ex. 1 | (5) | 3.3 | 25.6 |
| Comp. Ex. 2 | (6) | 2.8 | 28.4 |

As is apparent from Examples 1 to 4 in Table 2, the coating films obtained from the coating liquids which were produced using the fine particles of silica having a phenyl group exhibited a low dielectric constant and a high yield of product, while, as shown in Comparative Examples 1 and 2, the coating films obtained from the coating liquids which are produced using the fine particles of silica having no phenyl group exhibited a high dielectric constant and a low yield of product.

It is recognized from the results of Table 2 that the silica-containing films obtained from the coating liquids of the present invention exhibit a low dielectric constant and are excellent in not only oxygen plasma resistance during the microphotolithography working but also mechanical strength, chemical resistance (such as alkali resistance) and crack resistance. Therefore, excellent semiconductor devices can be provided by the use of the coating liquids according to the present invention.

Examples 5 and 6 and Comparative Examples 3 to 5

Each of the coating liquids (7) to (11) was applied by the spin coating method to a test piece of semiconductor substrate with a multi-layer wiring integrated at the design rule of 0.25μ and heated at 80° C. for 3 min for drying. Thereafter, heating was conducted in nitrogen gas at 250° C. for 30 min, thereby obtaining a coating film with the same thickness of 5000 Å. Furthermore, a $SiO_2$ film with a thickness of 4000 Å was formed on each of these coating films by the plasma CVD method. Then, a normal microphotolithography was carried out thereto to thereby form via holes, and remaining resists were removed by the RIE method. The resultant substrate with a via hole was washed with an organic amine and water. Barrier metals of TiN were formed by the sputtering technique, and W plugs were formed by the CVD and CMP techniques to thereby provide vias. Thereafter, the ethyl cellulose contained in the coating film was decomposed by oxygen plasma irradiation to thereby form a porous silica-containing film, and top-layer metal wirings were formed. Thus, there were obtained semiconductor devices.

With respect to each of the thus obtained semiconductor devices having a 100 continuous vias, the dielectric constant of the silica-containing film and the yield of the semiconductor devices with no defects of conductivity were measured in the same manner as mentioned above. The results are shown in Table 3.

TABLE 3

| Example | Coating liquid | Dielectric Constant | Yield of semiconductor devices with no defects (%) |
|---|---|---|---|
| Comp. Ex. 3 | (7) | 4.2 | 23.8 (cracked) |
| Example 5 | (8) | 1.8 | 99.9 |
| Example 6 | (9) | 1.7 | 99.9 |
| Comp. Ex. 4 | (10) | 3.6 | 32.6 |
| Comp. Ex. 5 | (11) | 3.3 | 23.4 |

Because of the film quality deterioration by oxygen plasma irradiation and the moisture adsorption during washing, the coating films as shown in the Comparative Examples exhibited a high dielectric constant and a low yield of the products.

It is recognized from the results of Table 3 that the silica-containing films obtained from the coating liquids of the present invention exhibit a low dielectric constant and are excellent in not only oxygen plasma resistance at the microphotolithography stage but also mechanical strength, chemical resistance (such as alkali resistance) and crack resistance.

Therefore, it has been demonstrated that excellent semiconductor devices can be provided by the use of the coating liquids according to the present invention.

What is claimed is:

1. A coating liquid for forming a silica-containing film with a low dielectric constant on a substrate, comprising:
   (i) fine particles of silica having a phenyl group thereon, and
   (ii) a polysiloxazane obtained by reacting a hydrolyzate or hydrolyzates of an alkoxysilane represented by the general formula (I) and/or a halogenated silane represented by the general formula (II) with a polysilazane represented by the general formula (III), each of the formulae is shown below:

$$X_nSi(OR^1)_{4-n} \quad (I)$$

$$X_nSiX'_{4-n} \quad (II), \text{ and}$$

$$(III)$$

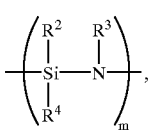

wherein X represents a hydrogen atom, a fluorine atom, an unfluorinated or fluorinated alkyl group having 1 to 8 carbon atoms, an aryl group or a vinyl group; each of $R^1$, $R^2$, $R^3$ and $R^4$ represents a hydrogen atom, an alkyl group having 1 to 8 carbon atoms, an aryl group or a vinyl group; X' represents a halogen atom; and m is an integer while n is an integer of 0 to 3.

2. A coating liquid for forming a silica-containing film with a low dielectric constant, comprising:
   (i) fine particles of silica having a phenyl group thereon, and
   (ii') an oxidatively decomposable resin,
   the weight ratio of the fine particles of silica having a phenyl group to the oxidatively decomposable resin being in the range of 0.5 to 5.

3. The coating liquid for forming a silica-containing film as claimed in claim 2, wherein the oxidatively decomposable resin is a resin which is soluble in an organic solvent and which is decomposed by heating in a gas containing oxygen at room temperature to 500° C. or by irradiation with ultraviolet light, infrared rays, electron beams, X-rays or oxygen plasma.

4. The coating liquid for forming a silica-containing film as claimed in claim 1, wherein the fine particles of silica having a phenyl group (i) are obtained by subjecting to the following steps:
   i) hydrolyzing at least one alkoxysilane represented by the general formula (I) as shown below, and thereafter, optionally aging the hydrolyzed alkoxysilane, to thereby obtain fine particles of silica, and
   ii) bonding a hydrolyzate of an alkoxysilane having a phenyl group and/or a chlorosilane having a phenyl group with a surface of at least part of the obtained fine particles of silica:

$$X_n Si(OR^1)_{4-n} \tag{I}$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; and n is an integer of 0 to 3.

5. The coating liquid for forming a silica-containing film as claimed in claim 4, wherein the alkoxysilane having a phenyl group is represented by the general formula (IV), and the chlorosilane having a phenyl group is represented by the general formula (V), each of the formulae is shown below:

$$X_p R^2_q Si(OR^1)_{4-(p+q)} \tag{IV}$$

and $$X_p R^2_q SiX'_{4-(p+q)} \tag{V}$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; $R^2$ represents a phenyl group; X' represents a chlorine atom; and p is an integer of 0 to 3 and q is an integer of 1 to 3 provided that p+q is an integer of not greater than 4.

6. The coating liquid for forming a silica-containing film as claimed in claim 4, wherein, in the obtaining of the fine particles of silica from at least one alkoxysilane represented by the above general formula (I), the hydrolysis of the alkoxysilane and aging of the hydrolyzed alkoxysilane is performed at 180° C. or higher.

7. A substrate coated with a silica-containing film with a low dielectric constant, which is formed from the coating liquid as claimed in claim 1.

8. A substrate coated with a porous silica-containing film with a low dielectric constant, which is obtained by applying the coating liquid as claimed in claim 2 to the substrate surface, and then decomposing the oxidatively decomposable resin contained in the coated film by heating in a gas containing oxygen or by irradiation with ultraviolet light, infrared rays, electron beams, X-rays or oxygen plasma.

9. The coating liquid for forming a silica-containing film as claimed in claim 2, wherein the fine particles of silica having a phenyl group (i) are obtained by subjecting to the following steps:
   i) hydrolyzing at least one alkoxysilane represented by the general formula (I) as shown below, and thereafter, optionally aging the hydrolyzed alkoxysilane, to thereby obtain fine particles of silica, and
   ii) bonding a hydrolyzate of an alkoxysilane having a phenyl group and/or a chlorosilane having a phenyl group with a surface of at least part of the obtained fine particles of silica:

$$X_n Si(OR^1)_{4-n} \tag{I}$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; and n is an integer of 0 to 3.

10. The coating liquid for forming a silica-containing film as claimed in claim 3, wherein the fine particles of silica having a phenyl group (i) are obtained by subjecting to the following steps:
   i) hydrolyzing at least one alkoxysilane represented by the general formula (I) as shown below, and thereafter, optionally aging the hydrolyzed alkoxysilane, to thereby obtain fine particles of silica, and
   ii) bonding a hydrolyzate of an alkoxysilane having a phenyl group and/or a chlorosilane having a phenyl group with a surface of at least part of the obtained fine particles of silica:

$$X_n Si(OR^1)_{4-n} \tag{I}$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; and n is an integer of 0 to 3.

11. The coating liquid for forming a silica-containing film as claimed in claim 9, wherein the alkoxysilane having a phenyl group is represented by the general formula (IV), and the chlorosilane having a phenyl group is represented by the general formula (V), each of the formulae is shown below:

$$X_p R^2_q Si(OR^1)_{4-(p+q)} \tag{IV}$$

and $$X_p R^2_q SiX'_{4-(p+q)} \tag{V}$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; $R^2$ represents a phenyl group; X' represents a chlorine atom; and p is an integer of 0 to 3 and q is an integer of 1 to 3 provided that p+q is an integer of not greater than 4.

12. The coating liquid for forming a silica-containing film as claimed in claim 10, wherein the alkoxysilane having a phenyl group is represented by the general formula (IV), and the chlorosilane having a phenyl group is represented by the general formula (V), each of the formulae is shown below:

$$X_p R^2_q Si(OR^1)_{4-(p+q)} \tag{IV}$$

and $$X_p R^2_q SiX'_{4-(p+q)} \tag{V}$$

wherein X represents a hydrogen atom, a fluorine atom, an unfluorinated or fluorinated alkyl group having 1 to 8 carbon atoms, an aryl group or a vinyl group; $R^1$ represents a hydrogen atom, an alkyl group having 1 to 8 carbon atoms, an aryl group or a vinyl group; $R^2$ represents a phenyl group; X' represents a chlorine atom; and p is an integer of 0 to 3 and q is an integer of 1 to 3 provided that p+q is an integer of not greater than 4.

13. The coating liquid for forming a silica-containing film as claimed in claim 9, wherein, in the obtaining of the fine particles of silica from at least one alkoxysilane represented by the above general formula (I), the hydrolysis of the alkoxysilane and aging of the hydrolyzed alkoxysilane is performed at 180° C. or higher.

14. The coating liquid for forming a silica-containing film as claimed in claim 10, wherein, in the obtaining of the fine particles of silica from at least one alkoxysilane represented by the above general formula (I), the hydrolysis of the alkoxysilane and aging of the hydrolyzed alkoxysilane is performed at 180° C. or higher.

15. The coating liquid for forming a silica-containing film as claimed in claim 11, wherein, in the obtaining of the fine particles of silica from at least one alkoxysilane represented by the above general formula (I), the hydrolysis of the alkoxysilane and aging of the hydrolyzed alkoxysilane is performed at 180° C. or higher.

16. The coating liquid for forming a silica-containing film as claimed in claim 12, wherein, in the obtaining of the fine particles of silica from at least one alkoxysilane represented by the above general formula (I), the hydrolysis of the alkoxysilane and aging of the hydrolyzed alkoxysilane is performed at 180° C. or higher.

17. A substrate coated with a silica-containing film with a low dielectric constant, which is formed from the coating liquid as claimed in claim 2.

18. A substrate coated with a silica-containing film with a low dielectric constant, which is formed from the coating liquid as claimed in claim 3.

19. A substrate coated with a silica-containing film with a low dielectric constant, which is formed from the coating liquid as claimed in claim 4.

20. A substrate coated with a silica-containing film with a low dielectric constant, which is formed from the coating liquid as claimed in claim 5.

21. A substrate coated with a silica-containing film with a low dielectric constant, which is formed from the coating liquid as claimed in claim 6.

22. A substrate coated with a porous silica-containing film with a low dielectric constant, which is obtained by applying the coating liquid as claimed in claim 3 to the substrate surface, and then decomposing the oxidatively decomposable resin contained in the coated film by heating in a gas containing oxygen or by irradiation with ultraviolet light, infrared rays, electron beams, X-rays or oxygen plasma.

* * * * *

UNITED STATES PATENT AND TRADEMARK OFFICE
CERTIFICATE OF CORRECTION

PATENT NO. : 6,562,465 B1
DATED : May 13, 2003
INVENTOR(S) : Akira Nakashima et al.

It is certified that error appears in the above-identified patent and that said Letters Patent is hereby corrected as shown below:

Column 5,
Line 28, between "fine" and "particles" delete period ".".

Signed and Sealed this

Ninth Day of September, 2003

JAMES E. ROGAN
*Director of the United States Patent and Trademark Office*